(12) United States Patent
Sato et al.

(10) Patent No.: US 10,161,055 B2
(45) Date of Patent: Dec. 25, 2018

(54) METHOD OF FORMING WIRING PATTERN AND ETCHING APPARATUS FOR FORMING WIRING PATTERN

(71) Applicant: TOYOTA JIDOSHA KABUSHIKI KAISHA, Toyota-shi, Aichi-ken (JP)

(72) Inventors: Yuki Sato, Nisshin (JP); Motoki Hiraoka, Toyota (JP); Hiroshi Yanagimoto, Myoshi (JP); Hiroki Usui, Toyota (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 144 days.

(21) Appl. No.: 15/087,263

(22) Filed: Mar. 31, 2016

(65) Prior Publication Data

US 2016/0289840 A1 Oct. 6, 2016

(30) Foreign Application Priority Data

Apr. 2, 2015 (JP) ................. 2015-076033

(51) Int. Cl.
| | |
|---|---|
| *C23F 1/00* | (2006.01) |
| *C03C 15/00* | (2006.01) |
| *C03C 25/68* | (2006.01) |
| *C25F 3/00* | (2006.01) |
| *C25D 5/08* | (2006.01) |
| *C25D 3/00* | (2006.01) |

(Continued)

(52) U.S. Cl.
CPC ............ *C25D 5/08* (2013.01); *C25D 3/00* (2013.01); *C25D 5/02* (2013.01); *C25D 7/00* (2013.01); *C25D 17/00* (2013.01); *C25D 17/005* (2013.01); *C25D 17/12* (2013.01); *C25D 21/10* (2013.01); *C25F 3/02* (2013.01); *C25F 7/00* (2013.01); *H05K 3/00* (2013.01); *C23C 18/1605* (2013.01); *C23C 18/30* (2013.01)

(58) Field of Classification Search
CPC ...... C23C 18/20; C23C 18/31; C23C 18/1633
See application file for complete search history.

(56) References Cited

U.S. PATENT DOCUMENTS

| | | | |
|---|---|---|---|
| 9,828,677 B2 * | 11/2017 | Hildreth | C23C 18/1608 |
| 2005/0052326 A1 * | 3/2005 | Gundlach | C23C 2/02 |
| | | | 343/733 |
| 2009/0057156 A1 * | 3/2009 | Haba | C23C 18/1608 |
| | | | 205/118 |

FOREIGN PATENT DOCUMENTS

| | | |
|---|---|---|
| JP | 2006-076020 A | 3/2006 |
| JP | 2014-185371 A | 10/2014 |

\* cited by examiner

*Primary Examiner* — Thomas T Pham
(74) *Attorney, Agent, or Firm* — Sughrue Mion, PLLC

(57) ABSTRACT

A method of forming a wiring pattern includes: a) forming a metal underlayer including a first underlying wiring layer which is in contact with an electrode, a second underlying wiring layer which is not in contact with the electrode, and an underlying connection layer which connects the first underlying wiring layer to the second underlying wiring layer; b) forming a metal plating layer on the metal underlayer through electroplating; and c) removing a metal connection portion through etching. The metal connection portion is the underlying connection layer covered with the metal plating layer. The etching includes bringing a solid electrolyte material that contains a solution into which metal of the metal connection portion is dissolved, into contact with the metal connection portion and applying a voltage between the metal connection portion and the solid electrolyte material.

7 Claims, 10 Drawing Sheets

(51) Int. Cl.
  *H05K 3/00* (2006.01)
  *C25D 5/02* (2006.01)
  *C25D 7/00* (2006.01)
  *C25D 17/00* (2006.01)
  *C25D 17/12* (2006.01)
  *C25D 21/10* (2006.01)
  *C25F 3/02* (2006.01)
  *C25F 7/00* (2006.01)
  *C23C 18/16* (2006.01)
  *C23C 18/30* (2006.01)

METHOD OF FORMING WIRING PATTERN AND ETCHING APPARATUS FOR FORMING WIRING PATTERN

INCORPORATION BY REFERENCE

The disclosure of Japanese Patent Application No. 2015-076033 filed on Apr. 2, 2015 including the specification, drawings and abstract is incorporated herein by reference in its entirety.

BACKGROUND OF THE INVENTION

1. Field of the Invention

The present invention relates to a method of forming a wiring pattern and an etching apparatus for forming a wiring pattern, in which a wiring pattern including plural metal wirings can be suitably formed on a surface of a resin substrate.

2. Description of Related Art

In the related art, when an electronic circuit is manufactured, a wiring pattern including plural metal wirings is formed on a surface of a resin substrate. For example, in Japanese Patent Application Publication No. 2006-076020 (JP 2006-076020 A), electroless plating layers (underlying wiring layers) are formed on a surface of a resin substrate so as to conform to a shape of a wiring pattern, and metal plating layers are laminated on the electroless plating layers (underlying wiring layers) through electroplating. As a result, a wiring pattern including plural metal wirings can be obtained in which the electroless plating layer formed of metal and the metal plating layer are sequentially laminated on the surface of the resin substrate.

However, when a wiring pattern is formed using the method disclosed in JP 2006-076020 A, the electroless plating layers as the underlying wiring layers are formed on the surface of the resin substrate so as to conform to shapes of the plural metal wirings. Therefore, the electroless plating layers, which are the underlying wiring layers of the respective metal wirings, are independently (discontinuously) formed on the surface of the resin substrate. As a result, when the metal plating layers are formed through electroplating, it is necessary to perform a connection work of electrically connecting all the electroless plating layers, which are underlying wiring layers of the respective metal wirings, to a power supply (negative electrode thereof) for electroplating individually using an electrode such as a conductive jig or the like. In particular, in order to form a wiring pattern having a complex shape (metal wirings having a complex shape) or a wiring pattern in which metal wirings are densely formed, it is difficult to perform the connection work on all the underlying wiring layers.

SUMMARY OF THE INVENTION

The invention provides a method of forming a wiring pattern and an etching apparatus for forming a wiring pattern, in which metal plating layers can be formed on underlying wiring layers through electroplating without bringing all the underlying wiring layers into contact with an electrode to be electrically connected to a power supply.

According to a first aspect of the invention, there is provided a method of forming a wiring pattern. The first aspect includes: a) forming a metal underlayer on a surface of a resin substrate, the metal underlayer including a first underlying wiring layer which is in contact with an electrode during electroplating, a second underlying wiring layer which is not in contact with the electrode during the electroplating, and an underlying connection layer which partially connects the first underlying wiring layer to the second underlying wiring layer; b) forming a metal plating layer on a surface of the metal underlayer through electroplating; and c) removing at least a portion of a metal connection portion through etching, the metal connection portion being the underlying connection layer covered with a portion of the metal plating layer. The step of c) includes impregnating a solid electrolyte material with a solution into which metal of the underlying connection layer and metal of the metal plating layer are dissolved, and the etching includes bringing the solid electrolyte material into contact with the portion of the metal connection portion and applying a voltage between an anode and a cathode, the cathode being the solid electrolyte material and the anode being the portion of the metal connection portion.

In the first aspect, the solid electrolyte material may be a first solid electrolyte membrane, a first surface of the first solid electrolyte membrane may have a protrusion to contact with a surface of the portion of the metal connection portion, and the etching may be performed in a state where a first conductive member is arranged on a second surface of the first solid electrolyte membrane, the electrode is in contact with the metal plating layer formed on the first underlying wiring layer, and a surface of the portion of the metal connection layer is in contact with the protrusion.

In the above aspect, the step of b) may include bringing a first surface of a second solid electrolyte membrane containing metal ions into contact with the metal underlayer, arranging a second conductive member on a second surface of the second solid electrolyte membrane, and forming the metal plating layer on the surface of the metal underlayer by setting the second conductive member as an anode, setting the metal underlayer as a cathode, and applying a voltage between the anode and the cathode.

In the above aspect, the wiring pattern may include a first metal wiring and a second metal wiring. The first metal wiring may include the first underlying wiring layer, a first end portion, and a second end portion. The first end portion may be positioned near a first edge portion of the surface of the resin substrate. The second end portion may be positioned near a second edge portion of the surface of the resin substrate. The first metal wiring may be provided in a region from the first edge portion to the second edge portion. The second metal wiring may include the second underlying wiring layer. Opposite end portions of the second metal wiring may be provided further inward from the first edge portion and the second edge portion on the resin substrate as compared to the first end portion and the second end portion. In the step of a), the metal underlayer may be formed on the surface of the resin substrate, the metal underlayer including the first underlying wiring layer which is formed to conform to a shape of the first metal wiring, the second underlying wiring layer which is formed to conform to a shape of the second metal wiring, and the underlying connection layer which connects the second underlying wiring layer to the first underlying wiring layer. In the step of b), the metal plating layer may be formed on the surface of the metal underlayer after arranging the electrode on at least one of the first edge portion and the second edge portion so as to come into contact with at least one of the first end portion and the second end portion.

According to a second aspect of the invention, there is provided an etching apparatus for forming a wiring pattern using the above-described method. The second aspect includes: a cathode; a solid electrolyte membrane that is arranged between the cathode and the metal connection portion that serves as an anode, the solid electrolyte membrane being configured to allow permeation of a solution in which metal of the metal connection portion is dissolved; and a power supply that applies a voltage between the metal connection portion and the cathode.

In the second aspect, the solid electrolyte membrane may have a protrusion that protrudes to conform to a shape of a surface of the metal connection portion such that the solid electrolyte membrane is in contact with the metal connection portion and is not in contact with the metal wirings.

According to the aspects of the invention, metal plating layers can be formed on underlying wiring layers through electroplating without bringing all the underlying wiring layers into contact with an electrode to be electrically connected to a power supply.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Hereinafter, an example of a method of forming a wiring pattern according to an embodiment of the invention will be described.

Figure 1A:
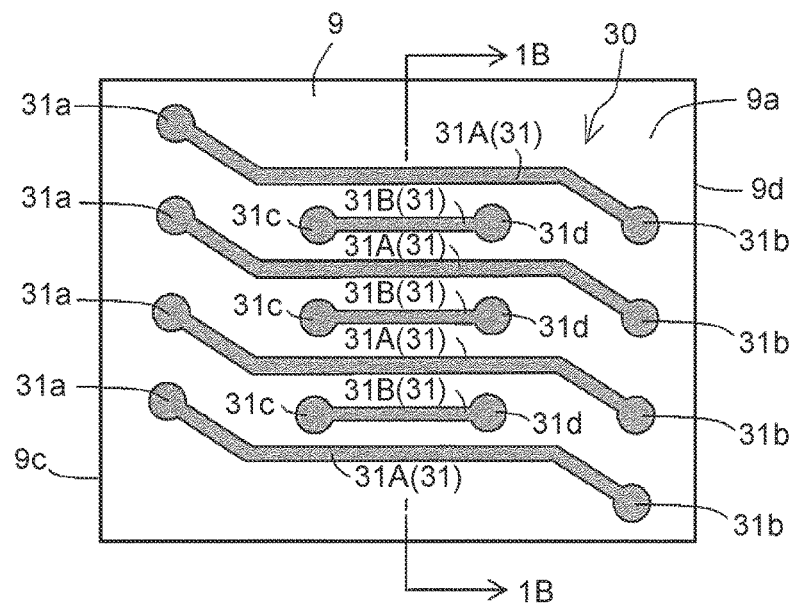
FIG. 1A is a plan view showing a wiring pattern which is formed using a formation method according to an embodiment of the invention.
Figure 1B:
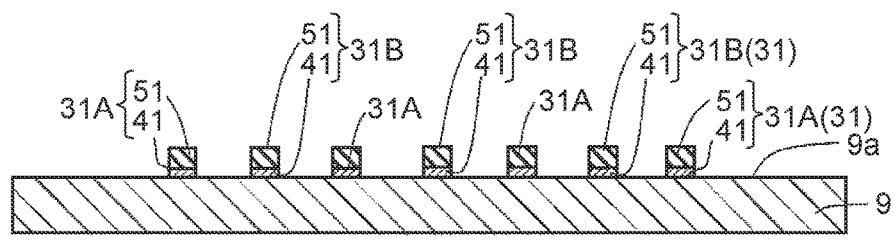
FIG. 1B is a sectional view taken along line 1B-1B of FIG. 1A.

FIGS. 1A and 1B are diagrams showing a wiring pattern 30 which is formed using the formation method according to the embodiment of the invention. FIG. 1A is a plan view, and FIG. 1B is a sectional view taken along line 1B-1B of FIG. 1A. In the embodiment, as shown in FIGS. 1A and 1B, the wiring pattern 30 including plural metal wirings 31, 31, . . . is formed on a surface 9a of a resin substrate 9. The plural metal wirings 31, 31, . . . of the wiring pattern 30 formed according to the embodiment include first metal wirings 31A and second metal wirings 31B.

The first metal wiring 31A includes a first end portion (pad) 31a and a second end portion (pad) 31b. The first end portion 31a is positioned near a first edge portion 9c of the surface 9a of the resin substrate 9. The second end portion 31b is positioned near a second edge portion 9d of the surface 9a of the resin substrate 9. The first metal wiring 31A is formed in a region from the first edge portion 9c to the second edge portion 9d. Opposite end portions 31c, 31d of the second metal wiring 31B are formed further inward from the edge portions 9c, 9d on the resin substrate 9 as compared to the first end portion 31a and the second end portion 31b of the first metal wiring 31A, and the second metal wiring 31B is formed along the first metal wiring 31A. The length of the second metal wiring 31B is shorter than the length of the first metal wiring 31A.

All the metal wirings 31 including the first metal wirings 31A and the second metal wirings 31B have a structure in which an underlying wiring layer 41 formed of metal and a metal plating layer 51 are sequentially laminated on the surface 9a of the resin substrate 9. The first metal wiring 31A and the second metal wiring 31B are provided on the surface 9a of the resin substrate 9, independently separated without being continuous with each other. The wiring pattern 30 is formed using the following method.

Figure 2:
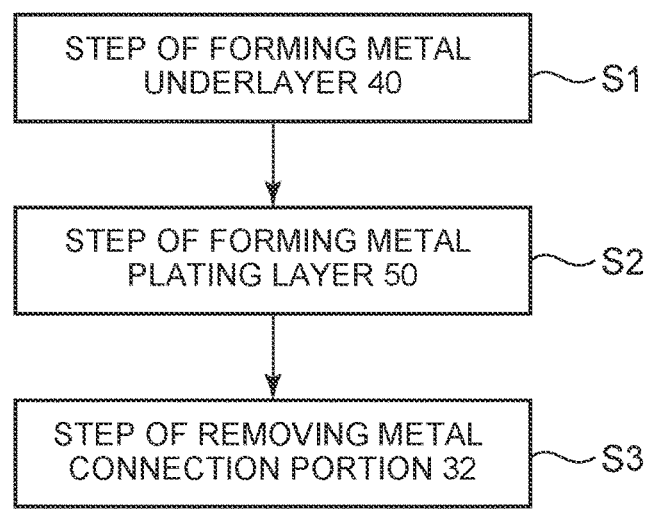
FIG. 2 is a flowchart showing the method of forming a wiring pattern according to the embodiment of the invention.

As shown in FIG. 2, a method of forming the wiring pattern 30 according to the embodiment includes three major steps including a step S1 of forming a metal underlayer 40, a step S2 of forming a metal plating layer 50, and a step S3 of removing a metal connection portion 32. Hereinafter, each of the steps will be described with reference to the drawings.

Figure 3A:
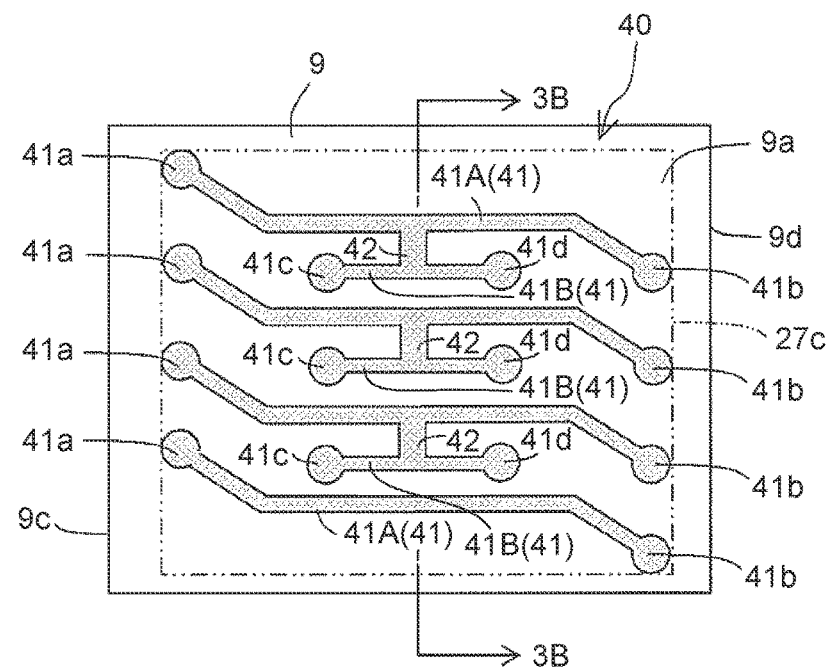
FIG. 3A is a plan view showing a resin substrate on which a metal underlayer is formed in a step of forming a metal underlayer.
Figure 3B:
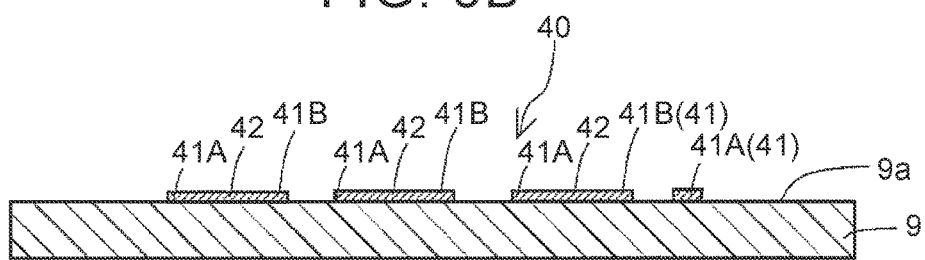
FIG. 3B is a sectional view taken along line 3B-3B of FIG. 3A.

FIGS. 3A and 3B are diagrams showing the step S1 of forming the metal underlayer 40. FIG. 3A is a plan view showing the resin substrate 9 on which the metal underlayer 40 is formed. FIG. 3B is a sectional view taken along line 3B-3B of FIG. 3A.

First, in the embodiment, the resin substrate 9 having a flat plate shape is prepared. As a resin constituting the resin substrate 9, for example, a thermoplastic resin, a thermosetting resin such as a phenol resin, or a resin obtained by adding a cyanate resin to an epoxy resin can be used. Examples of the thermoplastic resin include an epoxy resin, an ABS resin, an AS resin, an AAS resin, a PS resin, an EVA resin, a PMMA resin, a PBT resin, a PET resin, a PPS resin, a PA resin, a POM resin, a PC resin, a PP resin, a PE resin, a polymer alloy resin including an elastomer and PP, a modified PPO resin, a PTFE resin, and a ETFE resin.

The metal underlayer 40 including the plural underlying wiring layers 41, 41 is formed on the surface 9a of the prepared resin substrate 9. The metal underlayer 40 includes: the underlying wiring layers 41 that are underlayers of the metal wirings 31; and an underlying connection layer 42 formed of metal that partially connects the adjacent underlying wiring layers 41, 41. The underlying wiring layer 41 is a seed layer for forming a metal plating layer through electroplating described below.

Specifically, the metal underlayer 40 includes: a first underlying wiring layer 41A that is formed to conform to a shape of the first metal wiring 31A; and a second underlying wiring layer 41B that is formed to conform to a shape of the second metal wiring 31B. The metal underlayer 40 further includes the underlying connection layer 42 that connects the second underlying wiring layer 41B to the first underlying wiring layer 41A.

Here, the first underlying wiring layer 41A is in contact with a conductive jig 27 (electrode) during electroplating described below. The second underlying wiring layer 41B and the underlying connection layer 42 are not in contact with the conductive jig 27 (electrode) during electroplating described below.

More specifically, the first underlying wiring layer 41A includes a first end portion (pad underlayer) 41a and a second end portion (pad underlayer) 41b. The first end portion 41a is positioned near the first edge portion 9c of the surface 9a of the resin substrate 9. The second end portion 41b is positioned near the second edge portion 9d of the surface 9a of the resin substrate 9. The first underlying wiring layer 41A is formed in a region from the first edge portion 9c to the second edge portion 9d on the surface 9a of the resin substrate 9.

Opposite end portions 41c, 41d of the second underlying wiring layer 41B are formed further inward from the edge portions 9c, 9d on the resin substrate 9 as compared to the first end portion 41a and the second end portion 41b of the first underlying wiring layer 41A. Through the underlying connection layer 42, the center of the second underlying wiring layer 41B is connected to the center of the first underlying wiring layer 41A. Through the underlying connection layer 42, the second underlying wiring layer 41B is electrically connected (conductive) to the first underlying wiring layer 41A.

In the embodiment, the underlying connection layer 42 connects a pair of the first underlying wiring layer 41A and the second underlying wiring layer 41B to each other. However, the underlying connection layer 42 may connect all the pairs of the first underlying wiring layers 41A and the second underlying wiring layers 41B to each other. As a result, in the step S2 of forming the metal plating layer 50 described below, only the end portion 41a of one first underlying wiring layer 41A is brought into contact with the conductive jig (electrode). As a result, the metal underlayer 40 is electrically connected to a negative electrode of a power supply 26, and the metal plating layer 50 can be simply formed.

The above-described metal underlayer 40 can be formed, for example, using a slurry, which contains metal particles constituting the metal underlayer 40, according to a generally known printing technique. The metal underlayer 40 may also be formed using a masking material or the like.

Specifically, first, a masking material which has an opening having a shape of the metal underlayer 40 is arranged on the surface 9a of the resin substrate 9. Next, using spray coating, printing, or the like which is generally known, metal particles are arranged on the surface 9a of the resin substrate 9 so as to conform to a pattern shape of the metal underlayer 40. Next, the masking material is removed from the surface 9a of the resin substrate 9. As a result, the metal underlayer 40 is formed on the surface 9a of the resin substrate 9.

According to another method, a masking material which has an opening having a shape of the metal underlayer 40 is arranged on the surface 9a of the resin substrate 9. Next, using spray coating, a metal catalyst such as palladium is applied to the surface 9a of the resin substrate 9 so as to conform to a pattern shape of the metal underlayer 40. Next, the resin substrate 9 is dipped in an electroless plating solution after removing the masking material from the surface 9a of the resin substrate 9. As a result, the metal underlayer 40 is formed on the surface 9a of the resin substrate 9 through electroless plating.

Further, the metal underlayer 40 may be formed through the following steps of: laminating a metal foil on the surface 9a of the resin substrate 9; covering a portion corresponding to the metal underlayer 40 with a masking material; removing the other portions of the metal foil with an etchant; and removing the masking material from the metal underlayer 40.

Examples of metal constituting the metal underlayer 40 include copper, nickel, and silver. The metal constituting the metal underlayer 40 is not particularly limited as long as the following conditions are satisfied: the metal plating layer 50 can be formed on the metal underlayer 40 in the step S2 of forming the metal plating layer 50 described below; and the underlying connection layer 42 can be removed in the step S3 of removing the metal connection portion 32 described below.

Figure 4:
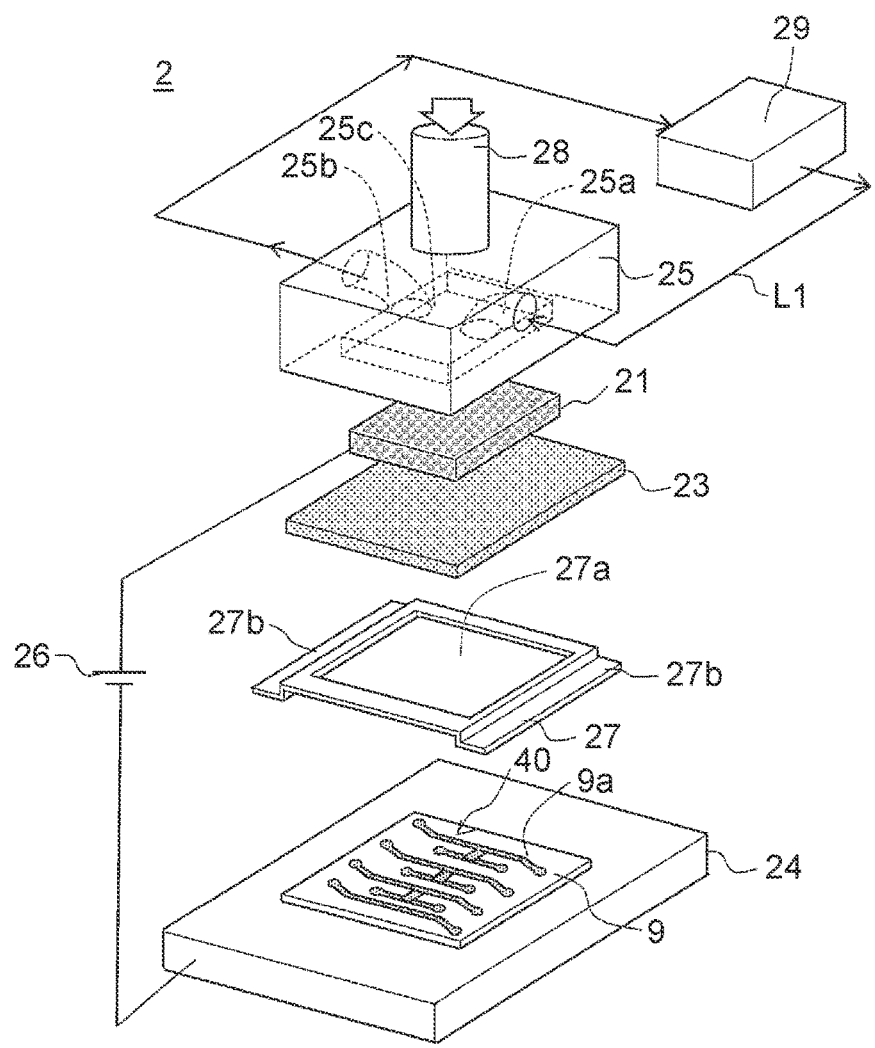
FIG. 4 is a schematic conceptual diagram showing a plating apparatus for forming a metal plating layer.
Figure 5A:
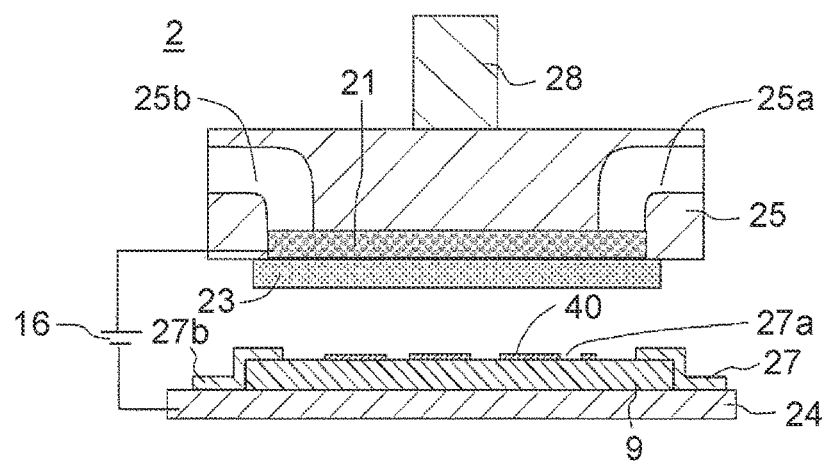
FIG. 5A is a schematic sectional view showing a state of the plating apparatus before plating.
Figure 5B:
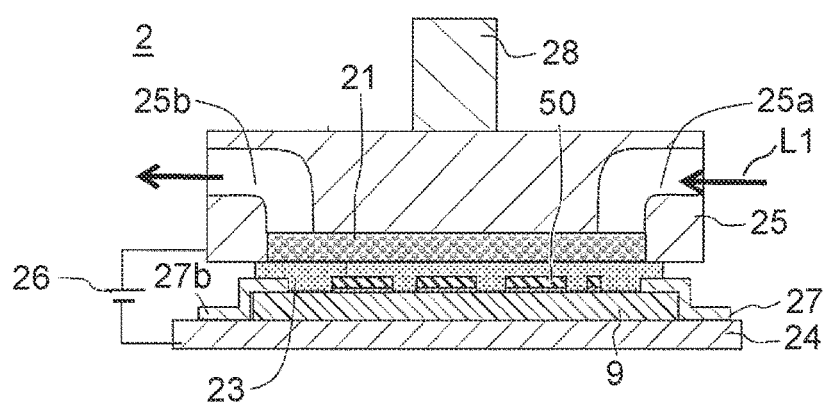
FIG. 5B is a schematic sectional view showing a state of the plating apparatus during plating.
Figure 6A:
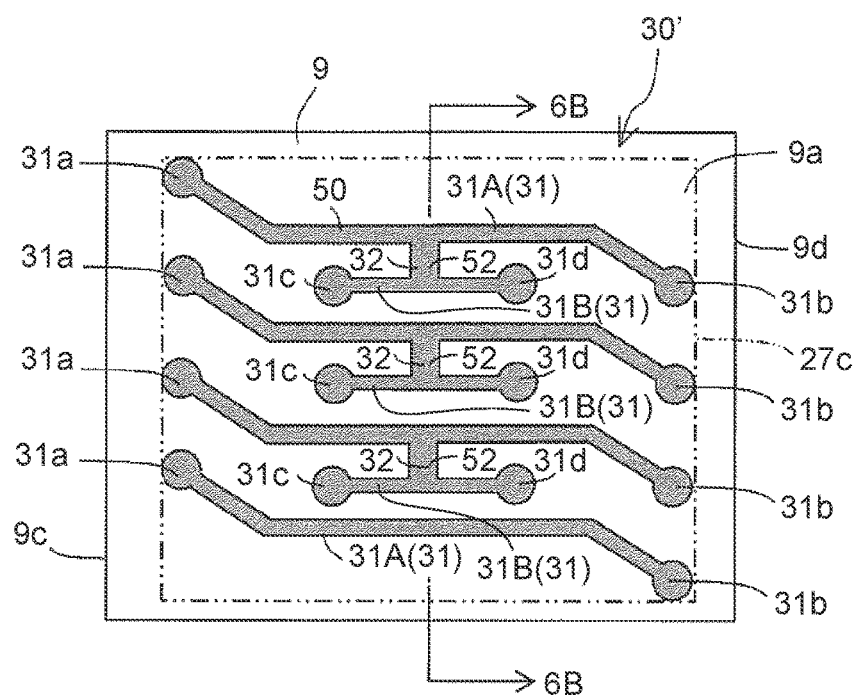
FIG. 6A is a plan view showing a resin substrate on which a metal plating layer is formed in a step of forming a metal plating layer.
Figure 6B:
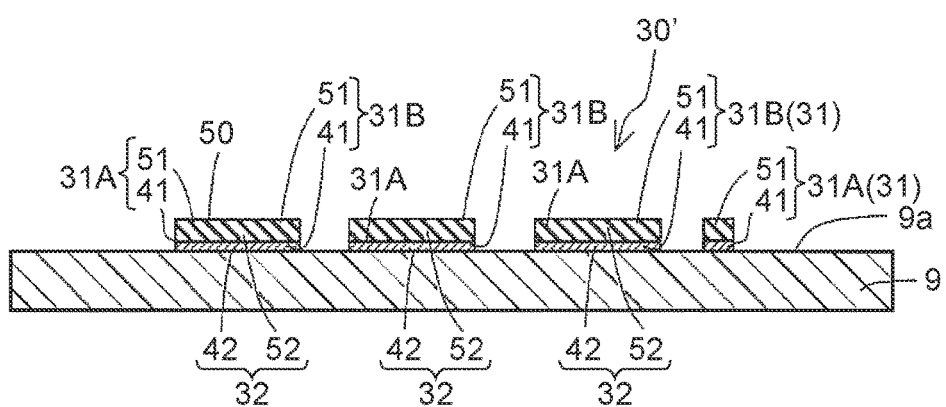
FIG. 6B is a sectional view taken along line 6B-6B of FIG. 6A.

After the step S1 of forming the metal underlayer 40, the process proceeds to the step S2 of forming the metal plating layer 50. FIG. 4 is a schematic conceptual diagram showing a plating apparatus 2 for forming the metal plating layer 50. FIG. 5A is a schematic sectional view showing a state of the plating apparatus 2 before plating. FIG. 5B is a schematic sectional view showing a state of the plating apparatus 2 during plating. FIG. 6A is a plan view showing the resin substrate 9 on which the metal plating layer 50 is formed in the step of forming the metal plating layer 50. FIG. 6B is a sectional view taken along line 6B-6B of FIG. 6A.

As shown in FIG. 4, in the embodiment, the plating apparatus 2 is an electroplating apparatus including at least: an anode (conductive member for plating) 21; a solid electrolyte membrane 23 for plating that is arranged between the anode 21 and the resin substrate 9; and the power supply 26 that applies a voltage between the anode 21 and the metal underlayer 40 (cathode).

In the embodiment, the plating apparatus 2 further includes a housing 25. The anode 21 is accommodated in a housing 25 that supplies a solution (hereinafter, referred to as "electrolytic solution") L1 containing ions of metal such as copper, nickel or silver to the anode 21. More specifically, in bottom of the housing 25, a housing concave portion 25c that accommodates the anode 21 is formed, and the anode 21 is accommodated in the housing concave portion 25c.

In the embodiment, in the housing 25, a supply path 25a, through which the electrolytic solution L1 is supplied to the housing 25, is formed on one side of the housing concave portion 25c to be connected to the housing concave portion 25c. A discharge path 25b, through which the electrolytic solution L1 is discharged from the housing 25, is formed on the other side of the housing concave portion 25c to be connected to the housing concave portion 25c.

The anode 21 is formed of a porous body that allows permeation of the electrolytic solution L1 and supplies metal ions to the solid electrolyte membrane. As a result, the electrolytic solution L1 supplied from the supply path 25a flows through the inside of the anode 21. A portion of the electrolytic solution L1 flowing through the inside of the anode 21 comes into contact with the solid electrolyte membrane 23 from the anode 21 such that the metal ions for plating are supplied to the solid electrolyte membrane 23.

Further, the electrolytic solution L1 which has passed through the inside of the anode 21 is discharged from the discharge path 25b.

The porous body constituting the anode 21 is not particularly limited as long as the following conditions are satisfied: (1) it has corrosion resistance to the electrolytic solution L1; (2) it has conductivity so as to function as the anode 21; (3) it can allow permeation of the electrolytic solution L1; and (4) it can be applied pressure by a pressing unit 28 described below. For example, it is preferable that the anode 21 is a metal foam formed of a material having a low oxygen overvoltage such as platinum or iridium oxide or a metal foam formed of a material having high corrosion resistance such as titanium which is coated with platinum, iridium oxide, or the like. In a case where a metal foam is used, it is preferable that the metal foam has a porosity of 50 vol % to 95 vol %, a pore size of 50 μm to 600 μm, and a thickness of 0.1 mm to 50 mm.

The supply path 25a and the discharge path 25b are connected to a solution supply unit 29 through a pipe. The solution supply unit 29 includes: a pump (not shown) that supplies the electrolytic solution L1, whose metal ion concentration is adjusted to a predetermined value, to the supply path 25a of the housing 25; and a collection tank (not shown) that collects the electrolytic solution L1 discharged from the discharge path 25b. The electrolytic solution L1 collected in the collection tank is supplied again by the pump. In this way, the electrolytic solution L1 can be circulated in the plating apparatus 2.

By bringing the solid electrolyte membrane 23 into contact with the above-described electrolytic solution L1, metal ions can be impregnated (contained) into the solid electrolyte membrane 23, and metal derived from the metal ions can be deposited on the surface of the metal underlayer 40 of the resin substrate 9 when a voltage is applied thereto. A material of the solid electrolyte membrane 23 is not particularly limited as long as the above-described functions can be exhibited. Examples of the material of the solid electrolyte membrane 23 include fluororesins, hydrocarbon resins, and polyamic acid resins such as NAFION (trade name) manufactured by DuPont; and resins having an ion exchange function such as SELEMION (CMV, CMD, CMF series) manufactured by Asahi Glass Co., Ltd.

The electrolytic solution L1 contains metal of the metal plating layer in the ion state as described above. Examples of the metal of the metal plating layer include copper, nickel, and silver. In the electrolytic solution L1, these metals are dissolved (ionized) in an acid such as nitric acid, phosphoric acid, succinic acid, sulfuric acid, or pyrophosphoric acid. For example, in a case where the metal is copper, examples of the electrolytic solution L1 include solutions of copper chloride, copper nitrate, copper phosphate, copper succinate, copper sulfate, copper pyrophosphate, and the like.

The plating apparatus 2 according to the embodiment includes the pressing unit 28 that is provided above the housing 25. As the pressing unit 28, for example, a hydraulic or pneumatic cylinder can be used. The pressing unit 28 presses the metal underlayer 40 with the solid electrolyte membrane 23 through the anode 21. Using the pressing unit 28, the metal plating layer 50 can be formed (plated) on the metal underlayer 40 while uniformly pressing the metal underlayer 40 with the solid electrolyte membrane 23.

The plating apparatus 2 according to the embodiment includes a metal stand 24 that is placed on the resin substrate 9. The metal stand 24 is electrically connected (conductive) to the negative electrode of the power supply 26. A positive electrode of the power supply 26 is electrically connected (conductive) to the anode 21 provided in the housing 25. Further, the plating apparatus 2 includes the conductive jig (electrode) 27 that is in contact with a portion (specifically, end portion) of the metal plating layer 50 during the formation of the metal plating layer 50 (during electroplating) such that the negative electrode of the power supply 26 is electrically connected to the metal plating layer 50.

Specifically, the conductive jig 27 is mounted to come into contact with some (specifically, first underlying wiring layers 41A) of the plural underlying wiring layers of the metal underlayer 40 during the formation of the metal plating layer 50. The conductive jig 27 is removable from a portion of the metal underlayer 40 which is in contact with the conductive jig 27. In the embodiment, the conductive jig 27 is arranged on the resin substrate 9 so as to be freely contactable with a portion of the metal underlayer 40.

Here, the conductive jig 27 is a metal plate covering the resin substrate 9. In the conductive jig 27, a through-hole 27a which has a rectangular shape corresponding to the size of the metal underlayer 40 is formed, and a pair of flange portions 27b are formed on opposite sides of the conductive jig 27. When the conductive jig 27 is arranged on the surface 9a of the resin substrate 9, the through-hole 27a is formed such that, in the surface 9a of the resin substrate 9, a peripheral edge portion is covered with the conductive jig 27 and the metal underlayer 40 is exposed through the through-hole 27a. Specifically, when the conductive jig 27 is arranged on the surface 9a of the resin substrate 9, a peripheral edge 27c of the through-hole 27a is in contact with the first underlying wiring layers 41A, and the conductive jig 27 is not contact with the second underlying wiring layers 41B.

In this way, in the embodiment, the conductive jig 27 is arranged so as to be in contact with the end portions 41a, 41b of each of the first underlying wiring layers 41A and to cover the peripheral edge portion of the surface 9a of the resin substrate 9. In the embodiment, the second underlying wiring layer 41B is connected to the first underlying wiring layer 41A through the underlying connection layer 42. Therefore, by bringing at least the first end portion 41a of the first underlying wiring layer 41A into contact with the conductive jig 27, the second underlying wiring layer 41B can also be simply made to be electrically connected to the conductive jig 27.

The conductive jig 27 is formed of metal with which a passive film can be easily formed or metal which is chemically stable. Specifically, in a case where the metal constituting the metal plating layer 50 is copper, nickel, or silver, it is preferable that the metal constituting the conductive jig 27 is aluminum, titanium, molybdenum, tungsten, or an alloy thereof.

During the formation of the metal plating layer 50, first, as shown in FIG. 5A, the conductive jig 27 is arranged on the surface 9a of the resin substrate 9 such that the metal underlayer 40 formed on the resin substrate 9 is exposed and that the pair of flange portions 27b are in contact with the metal stand 24. In this arrangement state, a portion of the peripheral edge 27c forming the through-hole 27a of the conductive jig 27 is in contact with the end portions 41a, 41b of each of the first underlying wiring layers 41A (refer to FIG. 3A). As a result, all the first and second underlying wiring layers 41A, 41B can be simply made to be electrically connected to the negative electrode of the power supply 26 through the metal stand 24 and the conductive jig 27.

In the embodiment, the conductive jig 27 is electrically connected to the negative electrode of the power supply 26 through the metal stand 24. However, the conductive jig 27 may be directly connected to the negative electrode of the power supply 26 without the metal stand 24, and a non-conductive stand may be used instead of the metal stand.

Next, as shown in FIG. 5B, by the pressing unit 28 pressing the surface of the solid electrolyte membrane 23 toward the metal underlayer 40, the solution supply unit 29 operates to supply the electrolytic solution L1 to the housing 25. As a result, the electrolytic solution L1 supplied to the housing 15 passes through the inside of the anode 21, which is a porous body, and the metal ions of the electrolytic solution L1 are supplied to the solid electrolyte membrane 23.

In this state, a voltage is applied between the anode 21 and the metal underlayer 40 (cathode). As a result, the metal ions contained in the solid electrolyte membrane 23 are reduced, and thus the metal plating layer 50 can be formed on the surface of the metal underlayer 40. Specifically, as shown in FIGS. 6A and 6B, a pattern 30' can be obtained in which the second metal wiring 32B is partially connected to the first metal wiring 31A through the metal connection portion 32.

In the embodiment, as the plating apparatus 2, an apparatus using the solid electrolyte membrane 23 is used to form the metal plating layer 50. However, for example, without using the solid electrolyte membrane 23, the metal plating layer 50 may be formed through the following steps of: dipping the conductive jig 27 and a resin substrate P in an electroplating solution of an electroplating bath, in which an anode is arranged, such that the metal underlayer 40 is opposite the anode; and applying a voltage between the anode and the metal underlayer 40 (cathode).

As shown in FIGS. 6A and 6B, the metal connection portion 32 is a layer where a surface of the underlying connection layer 42 is covered with a portion 52 of the metal plating layer 50. The metal connection portion 32 is a portion where the second metal wiring 32B is connected to the first metal wiring 31A, and this portion is unnecessary. Therefore, as described below, the metal connection portion 32 is removed through etching.

Figure 7:
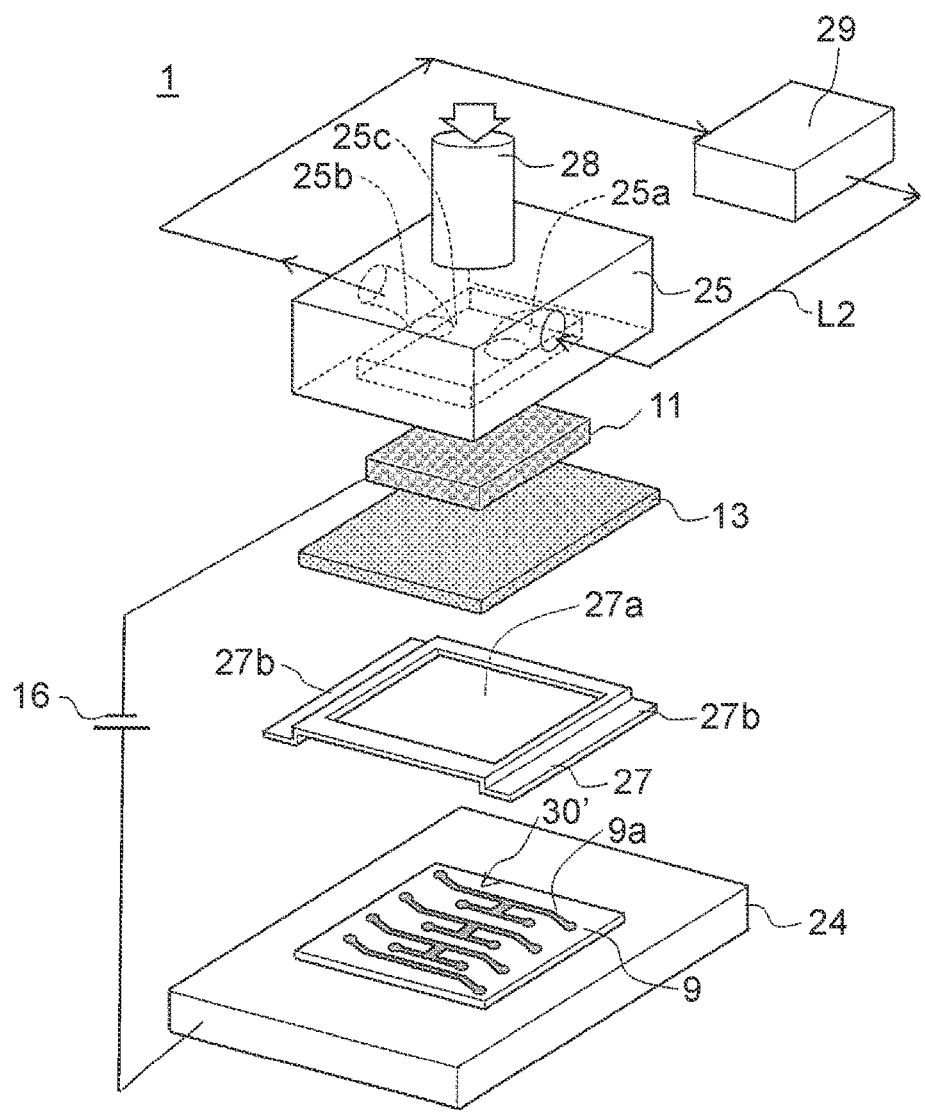
FIG. 7 is a schematic conceptual diagram showing an etching apparatus for removing a metal connection portion.
Figure 8:
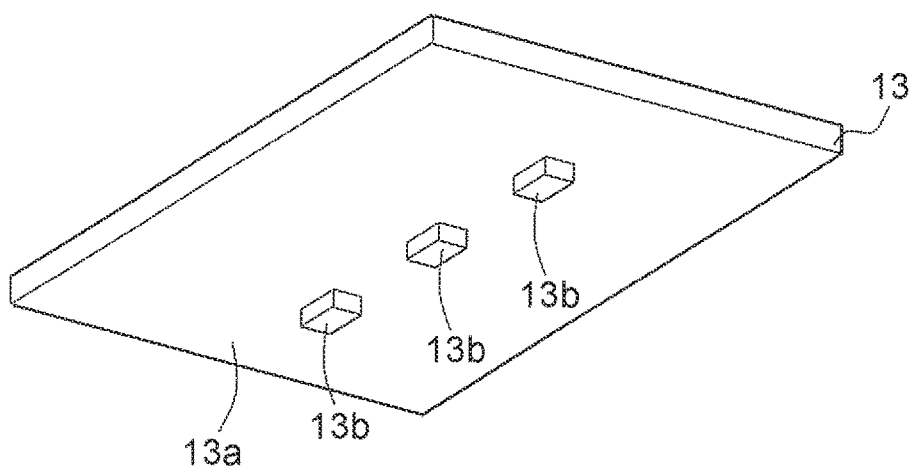
FIG. 8 is a schematic perspective view showing a surface of a solid electrolyte membrane of the etching apparatus.
Figure 9A:
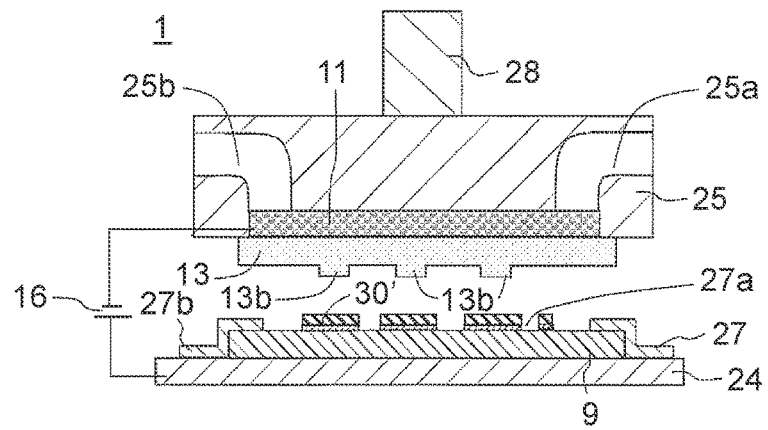
FIG. 9A is a schematic sectional view showing a state of the etching apparatus before etching.
Figure 9B:
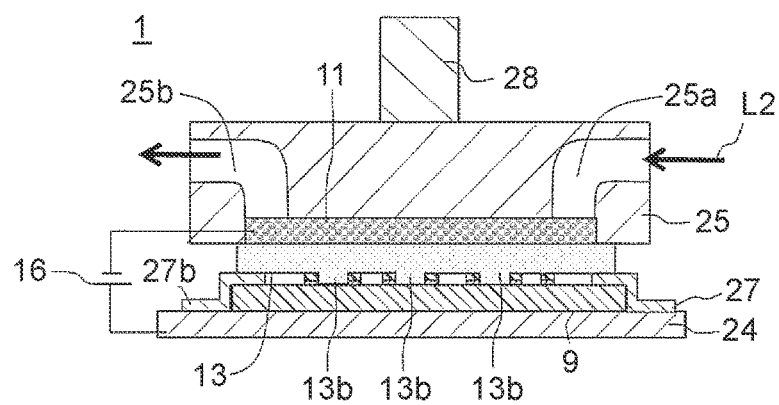
FIG. 9B is a schematic sectional view showing a state of the etching apparatus during etching.
Figure 9C:
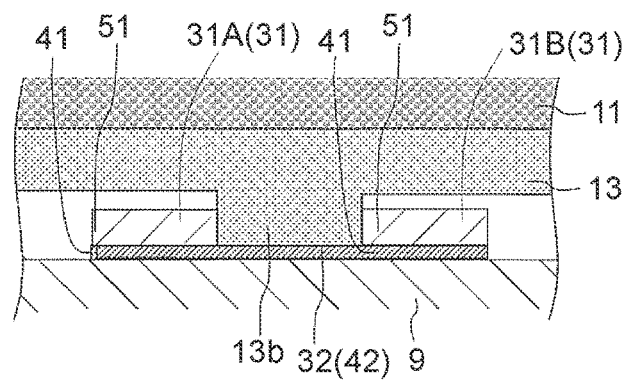
FIG. 9C is an enlarged view showing major components of FIG. 9B.

In the step S3 of removing the metal connection portion 32, an etching apparatus 1 shown in FIG. 7 is used. FIG. 7 is a schematic conceptual diagram showing an etching apparatus 1 for removing the metal connection portion 32. FIG. 8 is a schematic perspective view showing a surface of the solid electrolyte membrane 13 of the etching apparatus 1. FIG. 9A is a schematic sectional view showing a state of the etching apparatus 1 before etching. FIG. 9B is a schematic sectional view showing a state of the etching apparatus 1 during etching. FIG. 9C is an enlarged view showing major components of FIG. 9B.

According to the embodiment, in the etching apparatus 1, configurations of the metal stand 24, the housing 25, the pressing unit 28, and the solution supply unit 29 are the same as those of the plating apparatus 2 shown in FIG. 4. Therefore, these components are represented by the same reference numerals as above, and the description thereof will not be repeated. In the etching apparatus 1, a solution L2 in which metal of the underlying connection layer 42 and metal of the metal plating layer 50 (the portion 52 thereof) are dissolved is used instead of the electrolytic solution L1.

As shown in FIG. 7, the etching apparatus 1 includes: a cathode 11 (conductive member for etching); and a solid electrolyte membrane 13 for etching. The solid electrolyte membrane 13 is arranged between the cathode 11 and the pattern 30' (specifically, the metal connection portion 32), which is an anode, and allows permeation of the solution L2 where metal of the metal connection portion 32 is dissolved.

The cathode 11 is not particularly limited as long as the following conditions are satisfied: (1) it has corrosion resistance to the solution L2; (2) it can allow permeation of the solution L2; (3) it has conductivity so as to function as the cathode; and (4) the pressing unit 28 can press the solid electrolyte membrane 13 toward the surface of the metal plating layer 50 (the portion 52 thereof). For example, it is preferable that the cathode 11 is a metal foam formed of a material having a low oxygen overvoltage such as platinum or iridium oxide or a metal foam formed of a material having high corrosion resistance such as titanium which is coated with platinum, iridium oxide, or the like.

As shown in FIG. 8, in the solid electrolyte membrane 13, a protrusion 13b, which protrudes to conform to a shape of a surface of the metal connection portion 32 (underlying connection layer 42), is formed on a surface 13a opposite to the resin substrate 9 such that the solid electrolyte membrane 13 is in contact with the metal connection portion 32 and is not in contact with the metal wiring 31.

The solid electrolyte membrane 13 is formed of a material that allows permeation of the solution L2, that is, a material that allows permeation of hydrogen ions, hydroxide ions, chloride ions, or the like where metal of the metal connection portion 32 (the portion 52 of the metal plating layer 50 and the underlying connection layer 42) is dissolved. The solid electrolyte membrane 13 is not particularly limited as long as it can allow permeation of the solution L2 by being brought into contact with the solution L2.

Examples of the solution L2 include a potassium hydroxide aqueous solution, a ferric chloride aqueous solution, a nitric acid aqueous solution, and a sulfuric acid aqueous solution. For example, in a case where the solution L2 is an acidic solution such as a sulfuric acid aqueous solution or a nitric acid aqueous solution or a case where a component required for dissolution is cationic, examples of the material of the solid electrolyte membrane include fluororesins, hydrocarbon resins, and polyamic acid resins such as NAFION (trade name) manufactured by DuPont; and resins having a cation exchange function of conducting cations such as SELEMION (CMV, CMD, CMF series) manufactured by Asahi Glass Co., Ltd. In this case, the solid electrolyte membrane 13 is formed of the same material as that of the solid electrolyte membrane 23 of the plating apparatus 2.

For example, in a case where the solution L2 is an alkali solution or a case where a component required for dissolution is anionic (for example, a hydrochloric acid aqueous solution or a ferric chloride aqueous solution), examples of the material of the solid electrolyte membrane include resins having an anion exchange function such as NEOSEPTA (AMX, AHA, ACS) manufactured by ASTOM Corporation and SELEMION (AMV, AMT, AHO series) manufactured by Asahi Glass Co., Ltd.

During the removal of the metal connection portion 32, first, as shown in FIG. 9A, the conductive jig 27 is arranged on the surface 9a of the resin substrate 9 such that the pattern 30' formed on the resin substrate 9 is exposed and that the pair of flange portions 27b are in contact with the metal stand 24. In this arrangement state, a portion of an opening edge forming the through-hole 27a of the conductive jig 27 is in contact with the end portions 31a, 31b of each of the first metal wirings 31A, but each of the second metal wirings 31B is not in contact with the conductive jig 27 (refer to FIG. 6A). However, the second metal wiring 31B is connected to the first metal wiring 31A through the metal connection portion 32. Therefore, all the first and second metal wirings 31A, 31B can be simply made to be electrically connected to the positive electrode of the power supply 16 through the metal stand 24 and the conductive jig 27.

Next, as shown in FIG. 9B, by the pressing unit 28 pressing the surface of the metal connection portion 32 (the portion 52 of the metal plating layer 50) through the protrusion 13b of the solid electrolyte membrane 13, the solution supply unit 29 operates to supply the solution L2 to the housing 25. As a result, the solution L2 supplied to the housing 15 passes through the inside of the cathode 11, which is a porous body, and is supplied to the solid electrolyte membrane 13.

In this state, the power supply 16 applies a voltage between the cathode 11 and the metal connection portion 32 (anode). As a result, as shown in FIGS. 9B and 9C, the metal connection portion 32 can be removed through etching.

For example, in a case where the metal connection portion 32 is formed of copper and where the solution L2 is a nitric acid aqueous solution or a sulfuric acid aqueous solution, as described above, a membrane having a cation exchange function is selected as the solid electrolyte membrane 13. As a result, a reaction of $Cu \rightarrow Cu^{2+}+2e^-$ occurs on the anode (metal connection portion 32), a reaction of $2H^++2e^- \rightarrow H_2$ occurs on the cathode 11, and the metal connection portion 32 can be removed.

On the other hand, for example, in a case where the metal connection portion 32 is formed of copper and where the solution L2 is a hydrochloric acid aqueous solution, as described above, a membrane having an anion exchange function is selected as the solid electrolyte membrane 13. As a result, a reaction of $Cu+4Cl^- \rightarrow [CuCl_4]^{2-}-2e^-$ occurs on the anode (metal connection portion 32), a reaction of $2H^++2e^- \rightarrow H_2$ occurs on the cathode 11, and the metal connection portion 32 can be removed.

In this way, not only the underlying connection layer 42 having a surface 52a, which is covered with the portion 52 of the metal plating layer 50, but also the portion 52 of the metal plating layer 50 can be removed (the metal connection portion 32 can be removed) through etching. Therefore, even the complex wiring pattern 30 shown in FIGS. 1A and 1B can be simply formed.

In particular, in a case where plural metal wirings are densely formed or a case where the second metal wirings 31B are independently impregnated into a surface B of the resin substrate 9 as shown in FIG. 1A, it is difficult to electrically connect all the underlying wiring layers of the metal wirings directly to a power supply to perform plating.

However, when the underlying connection layer 42 is formed as in the embodiment, it is not necessary to electrically connect all the underlying wiring layers of metal wirings directly to a power supply. Therefore, a wiring pattern can be more simply formed.

Hereinafter, a verification test which was performed as an example of the invention will be described.

A copper sputtered film (Cu sputtered film) was formed on a surface of a resin substrate. Next, using the etching apparatus shown in FIG. 7, the copper sputtered film was partially etched. Specifically, a 10% sulfuric acid aqueous solution was used as a solution, and a platinum plating layer was formed on a surface of a porous body (manufactured by Mitsubishi Materials Corporation) formed of a titanium foam (10 mm×10 mm×1 mm) to prepare a cathode. As a solid electrolyte membrane, an electrolyte membrane (manufactured by DuPont; NAFION N117) having a thickness of 183 μm on which a protrusion (convex portion) was formed was used. The size of a surface of the protrusion (protruding surface) in contact with the copper sputtered film was 40 mm×40 mm.

Figure 10:
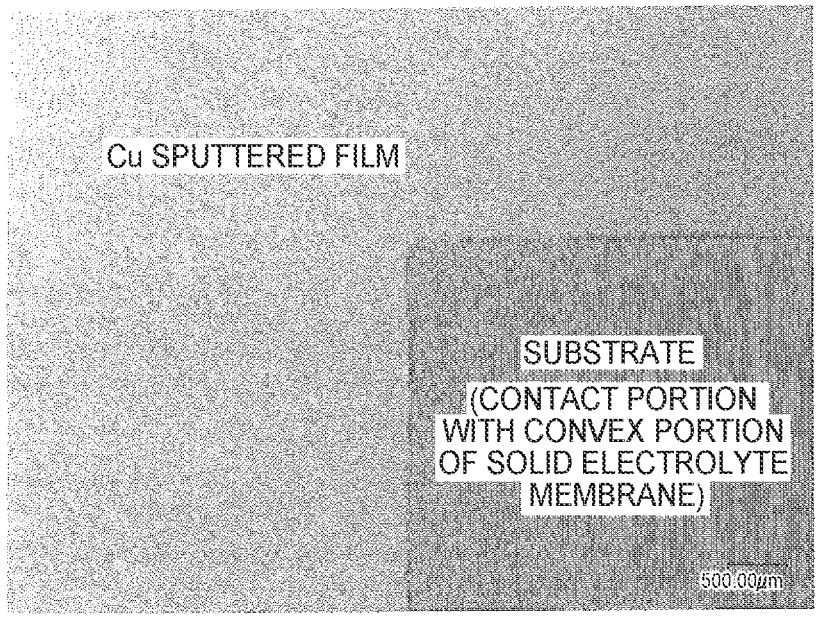
FIG. 10 is an image showing the result of a verification test.

The solid electrolyte membrane was pressed toward the copper sputtered film through the cathode, and etching was performed under conditions of applied pressure: 0.1 MPa, applied voltage: 3.0 V, treatment time: 10 minutes, and temperature: 25° C. (room temperature). The result is shown in FIG. 10. As shown in FIG. 10, the copper sputtered film only in a region, which was formed to conform to a shape of the protrusion (convex portion) of the solid electrolyte membrane, was removed.

What is claimed is:

1. A method of forming a wiring pattern, comprising:
   a) forming a metal underlayer on a surface of a resin substrate, the metal underlayer including
      a first underlying wiring layer which is in contact with an electrode during electroplating,
      a second underlying wiring layer which is not in contact with the electrode during the electroplating, and
      an underlying connection layer which partially connects the first underlying wiring layer to the second underlying wiring layer;
   b) forming a metal plating layer on a surface of the metal underlayer through the electroplating; and
   c) removing at least a portion of a metal connection portion through etching, the metal connection portion being the portion of the underlying connection layer covered with a portion of the metal plating layer, wherein
      the step of c) includes impregnating a solid electrolyte material with a solution for dissolving metal of the underlying connection layer and metal of the metal plating layer, and
      the etching includes
         bringing the solid electrolyte material, which has the solution impregnated therein, into contact with the portion of the metal connection portion, and
         applying a voltage between an anode and a cathode, the cathode being the solid electrolyte material and the anode being the portion of the metal connection portion, wherein the solution dissolves metal of the underlying connection layer and metal of the metal plating layer.

2. The method of forming a wiring pattern according to claim 1, wherein
   the solid electrolyte material is a first solid electrolyte membrane,
   a first surface of the first solid electrolyte membrane has a protrusion to contact with a surface of the portion of the metal connection portion, and
   the etching is performed in a state where a first conductive member is arranged on a second surface of the first solid electrolyte membrane, the electrode is in contact with the metal plating layer formed on the first underlying wiring layer, and a surface of the portion of the metal connection layer is in contact with the protrusion.

3. The method of forming a wiring pattern according to claim 2, wherein
   the step of b) includes
      bringing a first surface of a second solid electrolyte membrane containing metal ions into contact with the metal underlayer,
      arranging a second conductive member on a second surface of the second solid electrolyte membrane, and
      forming the metal plating layer on the surface of the metal underlayer by setting the second conductive member as an anode, setting the metal underlayer as a cathode, and applying a voltage between the anode and the cathode.

4. The method of forming a wiring pattern according to claim 3, wherein the wiring pattern include a first metal wiring and a second metal wiring, the first metal wiring includes the first underlying wiring layer, a first end portion, and a second end portion, the first end portion is positioned near a first edge portion of the surface of the resin substrate, the second end portion is positioned near a second edge portion of the surface of the resin substrate, the first metal wiring is provided in a region from the first edge portion to the second edge portion, the second metal wiring includes the second underlying wiring layer, opposite end portions of the second metal wiring are provided further inward from the first edge portion and the second edge portion on the resin substrate as compared to the first end portion and the second end portion, in the step of a), the metal underlayer is formed on the surface of the resin substrate, the metal underlayer including the first underlying wiring layer which is formed to conform to a shape of the first metal wiring, the second underlying wiring layer which is formed to conform to a shape of the second metal wiring, and the underlying connection layer which connects the second underlying wiring layer to the first underlying wiring layer, and in the step of b), the metal plating layer is formed on the surface of the metal underlayer after arranging the electrode on at least one of the first edge portion and the second edge portion so as to come into contact with at least one of the first end portion and the second end portion.

5. The method of forming a wiring pattern according to claim 1, wherein the solution for dissolving metal of the underlying connection layer and metal of the metal plating layer comprises at least one of hydrogen ions, hydroxide ions, or chloride ions.

6. The method of forming a wiring pattern according to claim 1, wherein the solution for dissolving metal of the underlying connection layer and metal of the metal plating layer is selected from the group consisting of a potassium hydroxide aqueous solution, a ferric chloride aqueous solution, nitric acid aqueous solution, and a sulfuric acid aqueous solution.

7. The method of forming a wiring pattern according to claim 1, wherein the metal of the underlying connection layer and the metal of the metal plating layer comprises at least one of copper (Cu), nickel (Ni), or silver (Ag).

* * * * *